United States Patent [19]

Besselere

[11] 4,169,755

[45] Oct. 2, 1979

[54] GROWTH OF CRYSTALLINE RODS OF GALLIUM ARSENIDE IN A CRUCIBLE OF SPECIALLY TREATED FIBROUS SILICON DIOXIDE

[75] Inventor: Jean-Pierre Besselere, Bretteville l'Orgueilleuse, France

[73] Assignee: U.S. Philips Corporation, New York, N.Y.

[21] Appl. No.: 886,406

[22] Filed: Mar. 14, 1978

[30] Foreign Application Priority Data

Mar. 16, 1977 [FR] France ............................ 77 07835

[51] Int. Cl.² ............................................. B01J 17/06
[52] U.S. Cl. ....................... 156/616 A; 156/DIG. 83; 156/617 H; 266/216; 432/156; 432/157
[58] Field of Search .................... 156/DIG. 83, 616 R, 156/616 A, 617 H; 23/273 SP, 292; 266/34 PT; 432/156, 157; 422/248

[56] References Cited

U.S. PATENT DOCUMENTS

| 3,796,548 | 3/1974 | Boss | 156/DIG. 83 |
| 4,010,064 | 3/1977 | Patrick | 156/DIG. 83 |

FOREIGN PATENT DOCUMENTS

| 2459591 | 7/1975 | Fed. Rep. of Germany | 156/616 |
| 1497527 | 6/1966 | France | 156/DIG. 83 |

Primary Examiner—Stephen J. Emery
Attorney, Agent, or Firm—Thomas A. Briody; Edward J. Connors, Jr.; Paul R. Miller

[57] ABSTRACT

A method of manufacturing a rod of crystalline material in a crucible formed at least partly by a fabric of refractory fibrous material.

Prior to its use the crucible is subjected to a preparatory treatment consisting mainly of wetting the inner face by means of gallium.

Application: Manufacture of rods of semiconductor material.

6 Claims, 1 Drawing Figure

U.S. Patent         Oct. 2, 1979         4,169,755
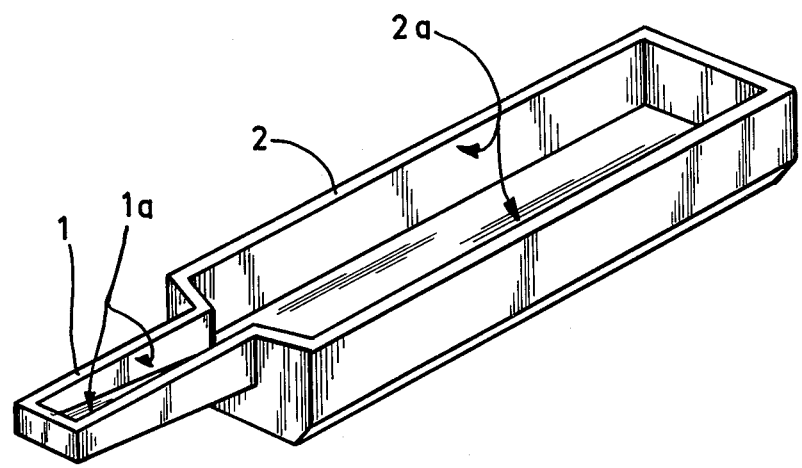

GROWTH OF CRYSTALLINE RODS OF GALLIUM ARSENIDE IN A CRUCIBLE OF SPECIALLY TREATED FIBROUS SILICON DIOXIDE

The present invention relates to an improvement in the method of manufacturing a rod of crystalline material by progressive controlled crystallisation of the material, which is previously brought in the liquid state in a melting crucible. The crucible is formed at least partly from a fabric of refractory fibrous material, the material being in direct contact only with the fabric.

The invention relates more in particular to the manufacture of rods of single semiconductor materials, for example, germanium, or compounds, notably binary compounds, for example gallium arsenide.

In order to obtain monocrystalline rods, the method is often used which consists in liquefying or synthesizing (in a liquid form in a crucible which is comparatively long with respect to its other dimensions), a suitable quantity of material to be treated and then performing the crystallisation of said material by a gradual cooling of the solidified mass which is initiated from one of the extremities of the crucible. For the solidification according to a monocrystalline structure it is known to contact the solidified mass with a seed of monocrystalline structure and to initiate the crystallisation from said seed.

The rods of semiconductor material which it is desired to obtain in a particularly pure state—which is the case especially with the III-V compounds, for example gallium arsenide—are generally manufactured in quartz crucibles because quartz can withstand high temperatures, provides nearly no impurities, and is substantially insensitive to chemical agents.

However, it frequently occurs that a rod manufactured in a quartz crucible adheres to the walls of said crucible. This causes defects of the crystal lattice, in particular, a large density of dislocations, and even a polycrystalline structure.

In order to avoid said adhesion it has been suggested to cover the inner walls of the crucible with a fine layer of graphite. Unfortunately, the graphite layer does not adhere sufficiently to the smooth walls of the quartz crucible and is easily torn off by the rod. Graphite particles are fixed to the rod and sometimes adhere completely to it and thus cause many rejects.

On the other hand it has been suggested, still to prevent the adherence, to line the inner wall of the crucible with a fabric of refractory material. The fabric constitutes a kind of cushion and the contact surface between the rod and said cushion is significantly smaller than the contact surface which the same rod would have with the crucible if same would be placed in the same crucible. Said measure has proved efficacious as regards the adhesion but the fabric of refractory material has the disadvantage of involving a considerable number of impurities which during the processing thereof land in the rod.

As a conclusion it may be said that it has up till now proved very difficult to obtain rods having both a good crystal quality and a high degree of purity. For certain applications (especially in the field of optoelectronics and very high frequencies) however, it is of the utmost importance to have materials which unite the two above properties.

It is the object of the present invention to provide an efficacious solution to this problem.

According to the invention, a method of manufacturing a rod of semiconductor material by increasing controlled crystallisation of the material, which was previously brought in a liquid state, in a crucible consisting at least partly of a fabric of refractory fibrous material, in which said material is in direct contact only with the fabric. Prior to the use thereof, the fabric is first subjected to a treatment consisting mainly of a wetting treatment, by means of gallium, of at least the contact face with the material, then heating in a suitable atmosphere at a temperature between 1150° and 1200° C. until the gallium has completely disappeared.

Applicants have established that the rods of semiconductor material which are manufactured in crucibles as described above and of which at least a part consists of a fabric of refractory fibrous material which has been subjected to the process according to the invention comprises a residual percentage of impurities which is very significantly lower than that of rods manufactured in identical, but non-treated, crucibles in which all further manufacturing conditions are the same.

It may be thought that such a result is at least partly related to a gettering effect exerted by gallium with respect to undesired impurities which are present in the meshes of the fabric. In a first period said impurities would associate with gallium, either in absorbed physical form or in the form of chemical compounds, and in a second period they would simultaneously be removed to the exterior together with the gallium. Although such a hypothesis is plausible, applicants to not want to base the invention on the correctness of said hypothesis.

The method according to the invention is the more favourable because it enables the manufacture of rods with a very small content of impurities without further deteriorating the conditions which are necessary for simultaneously obtaining rods having very good crystal qualities.

In a special embodiment of the method according to the invention the fabric of refractory fibrous material is a fabric of silicon oxide which is marketed by GENIN in Lyon and is called "Texti Glass". The fibrous nature of the fabric of silicon oxide enables gallium drops to "nestle" in the spaces between the fabrics. Experience has taught that after deposition said drops adhere completely to the fabric. So it can be achieved without great difficulties that the gallium is distributed very regularly over the whole surface of the fabric and during the subsequent heating thus ensures a "purification" over the whole thickness of the fabric.

The invention will now be described in greater detail with reference to the accompanying drawing.

The accompanying drawing shows, by way of non-limiting example, a crucible of a known shape which may be used for the manufacture of monocrystalline rods of semi-conductor material by increasing crystallisation in a horizontal position and which is designed so as to be excellently suitable for a preparation treatment according to the invention.

The crucible comprises two major parts: a seed support 1 which has substantially the shape of a beak and a more hollow and longer part 2 in which the melting and the crystallisation to from a rod of semiconductor material take place.

The said crucible is manufactured entirely, for example, from a silicon oxide fabric according to a method which is already described by applicants in the French Patent Application which was filed on May 12, 1977 and recorded under Nr. 7,614,250, which method will be described again hereinafter.

The fabric is first subjected to a cleaning treatment in two steps: first certain impurities, especially fats, are burnt by heating the fabric in the open air, then a chemical etching treatment is carried out for half an hour in a solution containing, for example, 25% hydrofluoric acid, 25% nitric acid and 50% water, the etching treatment being succeeded by excessive rinsing in demineralized water for approximately one hour.

When the fabric is still moist, it is laid on or in a mould which preferably is wetted, either with water or with a liquid having the property of evaporating slowly.

The fabric of silicon oxide assumes the desired shape either under the influence of its own weight or by pressure and pleating.

The last treatment consists in making it rigid in the provided shape by drying in a suitable manner. Said drying comprises a first step consisting of placing the assembly of mould and fabric in a drying hood which is heated at 150° C. and in which a substantially constant pressure of, for example, $10^{-2}$ mm mercury is maintained. The first drying serves to keep the fabrics in the desired shape. In order to make it rigid, it is then heated in the open air up to approximately 800° C.

According to the present invention, prior to its use, a crucible as described above and which is formed entirely by a fabric of refractory fibrous material, is subjected to a preparatory treatment consisting mainly of first wetting by means of gallium, at least on the inner face 1a, 2a which will be in contact with a semiconductor material, then heating in a suitable atmosphere at a temperature between 1150° C. and 1200° C. until the gallium has disappeared entirely.

It is favourable to perform the heating in a hydrogen atmosphere. In a first period, for example for 20 or minutes, the pressure in the furnace is kept substantially equal to atmospheric pressure; the pressure is then gradually reduced to a value between $10^{-5}$ and $10^{-6}$ mm mercury and heating is then continued for 10 to 15 minutes.

On the other hand it is desirable to proceed to degassing the crucible before depositing gallium in it. Said degassing is carried out in dry air at a pressure of $10^{-2}$ to $10^{-3}$ mm mercury at a temperature between 1150° C. and 1200° C. and takes approximately 20 to 30 minutes.

The whole of the above-described preparatory treatment according to the invention could be used when any fabric of refractory fibrous material is used which differs from the silicon oxide fabric of the example.

The wetting treatment of the fabric of means of gallium does not present any special difficulties. The gallium may be provided by means of a brush or by dipping.

It will be obvious that the preparatory treatments of a crucible are preferably carried out immediately before use thereof so as to reduce the possibilities of reabsorption of impurities, if any.

In the above example a crucible has been chosen which is manufactured entirely from a fabric of refractory fibrous material as an application object of the treatment according to the invention. It will be obvious that said treatment may be used without any change in the case of rigid crucibles manufactured, for example, from quartz or graphite and the walls of which are lined on the inside with a fabric of refractory fibrous material which is in contact only with the liquid or crystallized semiconductor material. In this latter case either the fabric only or the said fabric and the hard part of the crucible may be subjected in common to degassing and heating treatments in hydrogen, as provided within the scope of the invention.

The figures recorded in the following table which have been obtained with examples taken in different regions of gallium arsenide rods manufactured in strictly identical conditions, except the nature of the crucible or the treatment to which the said crucible has previously been subjected, shown unambiguously the favourable influence of the method according to the invention for the preparation of a crucible.

| Crucible | Concentration of residual impurities atoms $cm^{-3}$ | Mobility at 77° K. $cm^2 V^{-1} sec^{-1}$ | Number of dislocations $cm^{-2}$ |
|---|---|---|---|
| Sandblasted Quartz | $2.4 \times 10^{16}$ | 9600 | $>5 \times 10^4$ |
| Crude Quartz covered with an SiO$_2$ fabric | $5.3 \times 10^{17}$ | 2600 | $<5 \times 10^3$ |
| Treated Quartz covered with an SiO$_2$ fabric | $1.8 \times 10^{16}$ | 10200 | $<5 \times 10^3$ |

The recorded figures represent averages between several indications.

It has been found that only the rods manufactured in a crucible lined on the inside with a silicon oxide fabric treated according to the method of the invention, show simultaneously both a good electrical quality and a good crystal quality.

The method according to the invention is recommended in particular for the manufacture of monocrystalline rods of III-V compounds and in particular rods of gallium arsenide.

What is claimed is:

1. A method of manufacturing a rod of crystalline gallium arsenide in a melting crucible which is formed a least substantially in part from a fabric of a refractory fibrous silicon dioxide, comprising the steps of:
    a. first subjecting prior to its use said fabric to a treatment consisting mainly of wetting, by means of gallium, at least the contact surface of said fabric which comes in contact with the gallium arsenide,
    b. then heating said fabric in a suitable atmosphere at a temperature between 1150° and 1200° C. until the said gallium has disappeared completely,
    c. charging the treated crucible with gallium arsenide,
    d. melting said gallium arsenide in said crucible, said gallium arsenide being in direct contact only with said treated fabric, and
    e. solidifying said gallium arsenide by progressive controlled crystallization along the length of said crucible.

2. A method as in claim 1, wherein said heating treatment is carried out in an atmosphere of hydrogen, first for 20 to 30 minutes under a pressure which is substantially equal to atmospheric pressure, then for 10 to 15 minutes under a pressure between $10^{-5}$ and $10^{-6}$ mm mercury.

3. A method as in claim 1, wherein prior to providing the gallium said fabric is subjected to a heating treatment in dry air for 20 to 30 minutes at a pressure of $10^{-2}$ to $10^{-3}$ mm mercury at a temperature between 1150° C. and 1200° C.

4. A method as in claim 1, wherein said fabric is of silicon oxide fibres.

5. A rod of crystalline gallium arsenide obtained by progressive controlled crystallization of said material from the liquid phase, as recited in claim 1.

6. A method of manufacturing a rod of crystalline gallium arsenide comprising preparing a crucible for holding the molten gallium arsenide, said crucible being formed of a fabric of refractory fibrous silicon dioxide, pretreating said crucible by heating in dry air for 20 to 30 minutes at a pressure of $10^{-2}$ to $10^{-3}$ mm. mercury at a temperature between 1150° and 1200° C., wetting with liquid gallium the contact surface of the crucible which comes in contact with the gallium arsenide, heating in an atmosphere of hydrogen at a temperature between 1150° and 1200° C. until the gallium has completely disappeared, first for 20 to 30 minutes under a pressure which is substantially equal to atmospheric pressure, then for 10 to 15 minutes under a pressure between $10^{-5}$ and $10^{-6}$ mm. mercury, charging the crucible with gallium arsenide, melting the gallium arsenide and progressively crystallizing the gallium arsenide along the length of said crucible.

* * * * *

UNITED STATES PATENT OFFICE
CERTIFICATE OF CORRECTION

Patent No. 4,169,755         Dated October 2, 1979

Inventor(s) JEAN-PIERRE BESSELERE

It is certified that error appears in the above-identified patent and that said Letters Patent are hereby corrected as shown below:

Col.4, line 38,   After "formed" change "a" to -- at --

Col.4, line 46,   After "until" delete "the"

Col.4, line 68,   After "oxide" change "fibres"

to -- fibers --

Col.5, line 2,    After "said" delete "material" and insert -- gallium arsenide --

Signed and Sealed this

Seventeenth Day of February 1981

[SEAL]

Attest:

Attesting Officer

RENE D. TEGTMEYER

Acting Commissioner of Patents and Trademarks